(12) United States Patent
Zickel et al.

(10) Patent No.: US 9,679,686 B2
(45) Date of Patent: Jun. 13, 2017

(54) PROCESS TUNABLE RESISTOR WITH USER SELECTABLE VALUES

(75) Inventors: Scot E. Zickel, Hillsboro, OR (US); Tripti Nayak, Hillsboro, OR (US); Alexandra M. Kern, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 494 days.

(21) Appl. No.: 13/977,049

(22) PCT Filed: Dec. 23, 2011

(86) PCT No.: PCT/US2011/067188
§ 371 (c)(1),
(2), (4) Date: Sep. 29, 2013

(87) PCT Pub. No.: WO2013/095632
PCT Pub. Date: Jun. 27, 2013

(65) Prior Publication Data
US 2014/0016281 A1    Jan. 16, 2014

(51) Int. Cl.
*H05K 7/00* (2006.01)
*H01C 10/30* (2006.01)
*H01L 23/522* (2006.01)
*H01L 49/02* (2006.01)
*H01C 10/16* (2006.01)
*H01C 10/46* (2006.01)
(Continued)

(52) U.S. Cl.
CPC ............. *H01C 10/30* (2013.01); *H01C 10/16* (2013.01); *H01C 10/46* (2013.01); *H01C 17/23* (2013.01); *H01L 22/14* (2013.01); *H01L 22/20* (2013.01); *H01L 23/5228* (2013.01); *H01L 28/20* (2013.01); *H01L 2924/0002* (2013.01)

(58) Field of Classification Search
USPC ........................................ 361/760, 748, 761
See application file for complete search history.

(56) References Cited

U.S. PATENT DOCUMENTS 4,906,966 A    3/1990 Imamura et al.
5,066,996 A    11/1991 Hara et al.
(Continued)

FOREIGN PATENT DOCUMENTS

CN    1253363 A    5/2000
CN    1641880 A    7/2005
(Continued)

OTHER PUBLICATIONS

International Preliminary Report on Patentability and Written Opinion received for PCT Patent Application No. PCT/US2011/067188 mailed on Jul. 3, 2014, 7 pages.
(Continued)

*Primary Examiner* — Andargie M Aychillhum
(74) *Attorney, Agent, or Firm* — Patent Capital Group

(57) ABSTRACT

A process tunable resistor is fabricated by adjusting elements of the resistor during a fabrication process. The elements include legs, turns, and elements such as a parallel sub-legs, that are adjusted in the fabrication process to provide a specific user defined resistance value. The process tunable resistor provides for fixed contact points in order to support pre-existing or define circuit designs.

23 Claims, 4 Drawing Sheets

(51) Int. Cl.
*H01L 21/66* (2006.01)
*H01C 17/23* (2006.01)

(56) References Cited

U.S. PATENT DOCUMENTS

| | | | | |
|---|---|---|---|---|
| 5,689,428 | A | * | 11/1997 | Sauerbrey ............ H01B 1/12 257/E23.148 |
| 2005/0153504 | A1 | * | 7/2005 | Kawazoe ........... G11C 13/0007 438/222 |
| 2006/0087401 | A1 | | 4/2006 | Kerr et al. |
| 2011/0140069 | A1 | | 6/2011 | Inoue |

FOREIGN PATENT DOCUMENTS

| | | |
|---|---|---|
| CN | 1905190 A | 1/2007 |
| EP | 445765 | 9/1991 |
| JP | 2001-053226 A | 2/2004 |
| KR | 10-2010-0048752 A | 5/2010 |
| WO | 2013/095632 A1 | 6/2013 |

OTHER PUBLICATIONS

Office Action received for Taiwan Patent Application No. 101149006, mailed on Oct. 9, 2014, 7 pages of English Translation and 5 pages of Taiwan Office Action.
International Search Report and Written Opinion Received for PCT Patent Application No. PCT/US2011/67188, Mailed on Sep. 3, 2012, 10 pages.
Office Action received for Chinese Patent Application No. 201180075881.8, mailed on Jun. 21, 2016, 9 pages of Chinese Office Action.
Notice of Allowance received for Taiwan patent Application No. 101149006, mailed on May 25, 2015, 2 Pages.
Office Action issued in German Patent Application No. 11 2011 105 993.0 mailed on Sep. 7, 2016; English translation.

* cited by examiner

PROCESS TUNABLE RESISTOR WITH USER SELECTABLE VALUES

BACKGROUND

In fabrication of semiconductor components and devices, processes mature and change. Changes in a process of one component, such as a transistor, affects the processes of other components such as resistors. Typically, this is the case when the components make use of common materials, contact points, etc. For example, the same process step may be used in fabricating a transistor and resistor.

For example, performance changes to a transistor may dictate a change in the process. Therefore, process changes also follow as to an affected resistor. The affected resistor therefore may have to be able to deal with whatever change is dictated by the new process, such as a different trench resistance. Furthermore, as the process matures, different materials may be used, thus affecting resistance values of the resistors.

In designing a circuit architecture, a particular resistance value is called for. Therefore, any future process changes must account for particular resistance values. To accommodate process changes, a typical approach is to provide a large variation in resistance in the circuit design; however, this may lead to compromises in architecture design. Other approaches include a new circuit design, revising dies, re-tuning the product in development phase, and/or the use of precision resistors. Such solutions have been shown to be time consuming and costly.

BRIEF DESCRIPTION OF THE DRAWINGS

The detailed description is described with reference to accompanying figures. In the figures, the left-most digits) of a reference number identifies the figure in which the reference number first appears. The same numbers are used throughout the drawings to reference like features and components.

DETAILED DESCRIPTION

Overview

Described herein are processes to tune a resistor in fabrication process to match predefined values. The resistor provides for fixed connection points, which do not affect circuit design. In certain implementations, drawing mask layers are modified to adjust the resistor without impacting the placement or connection of the resistor in the circuit design. The resistor may be built from a collection of elements in order to provide different resistor values. In an implementation, a "turn" section or sections of the resistor are adjusted, or slid, to tune the resistance value of the resistor. In another implementation, parallel elements or sub-legs may be added or deleted to achieve a particular resistance value.

In the following detailed description, numerous specific details are set forth in order to provide a thorough understanding of the invention. However, it be understood by those of ordinary skill in the art that the present invention may be practiced without these specific details. In other instances, well-known methods, procedures, components and circuits have not been described in detail so as not to obscure the present invention.

Example Semiconductor Device

Figure 1:
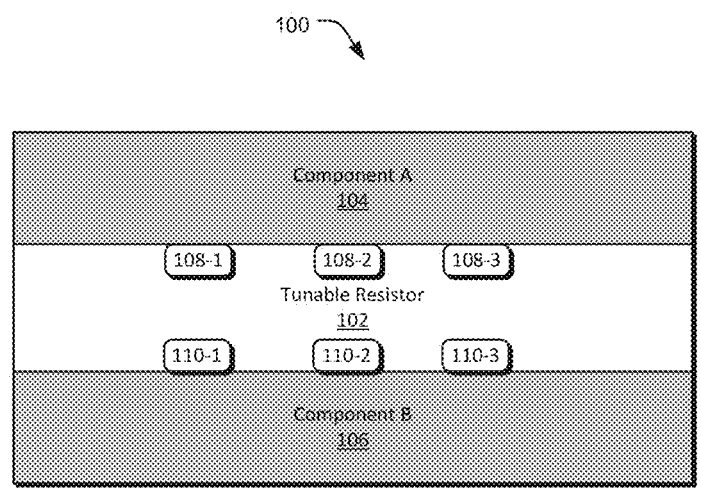
FIG. 1 is a diagram illustrating an example device implementing a tunable resistor.

FIG. 1 illustrates an example semiconductor device 100 that includes a process tunable resistor 102. The process tunable resistor 100 is fabricated along with one or more other components, such as component A 104 and component B 106. It is to be understood, that semiconductor device 100, along process tunable resistor 102, and component A 104 and component B 106 may be fabricated using various known semiconductor processes, such as mask layering, deposition, etc. It is also to be understood that various materials may be used in fabricating semiconductor device 100, process tunable resistor 100, component A 104 and component B 106.

Semiconductor device 100, along process tunable resistor 100, and component A 104 and component B 106 may be part of a larger circuit design or architecture. In certain implementations, process tunable resistor 100 has a fixed circuit design resistance that does not change regardless of the fabrication process of semiconductor device 100. In other words, as a fabrication process matures or changes, the resistance value of the process tunable resistor 100 remains the same.

Figure 2:
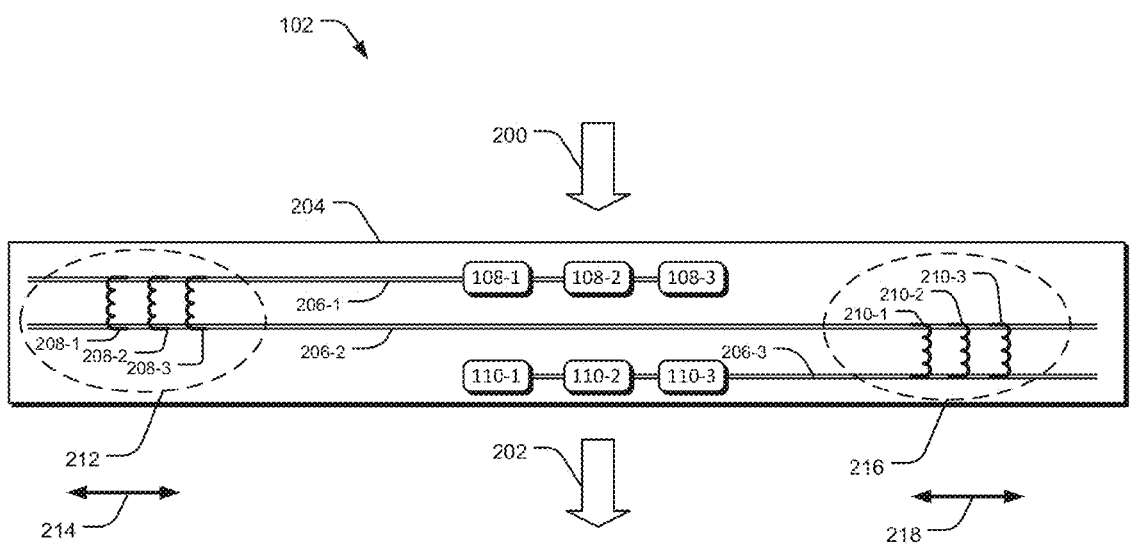
FIG. 2 is a diagram illustrating an example process tunable resistor with selectable values using sliding tunable legs and turns, to adjust resistance.

Process tunable resistor 102 provides one or more fixed input connection points 108 (e.g., connection points 108-1, 108-2, and 108-3), and one or more fixed output connection points 110 (e.g., connection points 110-1, 110-2, and 110-3). In particular, input connection points 108 and output connection points 110 are used for input current and output current respectively for process tunable resistor 102. In the example of FIG. 2, input current may be provided by component A 104 and output current is provided to component B 106.

Example Process Tunable Resistor

Referring now to FIG. 2, an example process tunable resistor 102 is shown. As discussed above, the process tunable resistor 102 is fabricated or processed with one or more other components in manufacturing a semiconductor device, such as semiconductor device 100.

An input current 200 may be received from one or more components through one or more fixed input connection points 108 (e.g., connection points 108-1, 108-2, and 108-3). Furthermore, an output current 202 may be provided through one or more fixed output connection points 110 (e.g., connection points 110-1, 110-2, and 110-3).

A die area 204 is provided for the process tunable resistor 102. The die area 204 may be fixed. In other words, as the fabrication process for the process tunable resistor 102 changes (matures), the die area 204 remains the same. Various known materials may make up the die area 204, and process tunable resistor 102.

In this example, process tunable resistor 102 includes three legs 206-1, and 206-3. The legs 206 may remain a fixed length as the fabrication process changes (matures). Leg 206-1 connects with fixed input connection points 108, and leg 206-3 connects with fixed output connection points 110.

Legs 206-1 is connected to leg 206-2 through turns 208. In this example, three turns 208-1, 208-2 and 208-3 are provided; however, it is appreciated that a different number of turns may be provided. Furthermore, it is understood that different configurations, other than turns, may be implemented. Likewise, leg 206-3 is connected to leg 206-2 through turns 210. In this example, three turns 210-1, 210-2 and 210-3 are provided; however, it is expected that a different number of turns may be provided. Therefore, actual resistance is provided through connections 108 and 110, legs 206, and turns 208 and 210.

Turns 208 may be grouped as a collective group 212, and turns 210 may be grouped as a collective group 216. The groups 212 and 216, and turns 208 and 210, may be initially placed at a particular location along legs 206, and on die area 204. Initial placement may be used to accommodate anticipated resistance re-targeting. For example, if the die area material has a particular resistance value, initial placement of groups 212 and 216 may be towards the end of the legs 206 or end of the die area. 204. In effect, the sliding of the groups 212 and 216 is analogous to a sliding a "trombone", where the "tuning" is directed to a particular resistance value.

In future processes, the groups 212 and 216 may be brought in towards the center (i.e., connections 108 and 110) to decrease resistance. In other instances, as the process matures or changes, the material resistance of die area 204 may change. In other words, material used for die area 204 in succeeding processes may have a higher resistance. Therefore, in order to keep the same resistance value of resistor 102, according to the pre-existing architectural design, the groups 212 and 216 may be brought in, thus keeping the same resistance value of a preceding process. Further to support the pre-existing architectural design, as discussed, connections 108 and 110 remain in the same location, making the new process transparent to the architectural design.

In a particular implementation, legs 2064 and 206-3 are balanced with equal lengths, and are considered symmetrical. This symmetrical legging may compensate for additional variations in processes. In other implementations, asymmetrical legging may be used. As discussed above, mask layering may be used to process/manufacture the process tunable resistor 102 and its components. In certain process, a re-tape of a mask for groups 212 and 216 (i.e., turns 208 and 210) may be performed.

Process Tunable Resistor, Alternate Implementation

Figure 3:
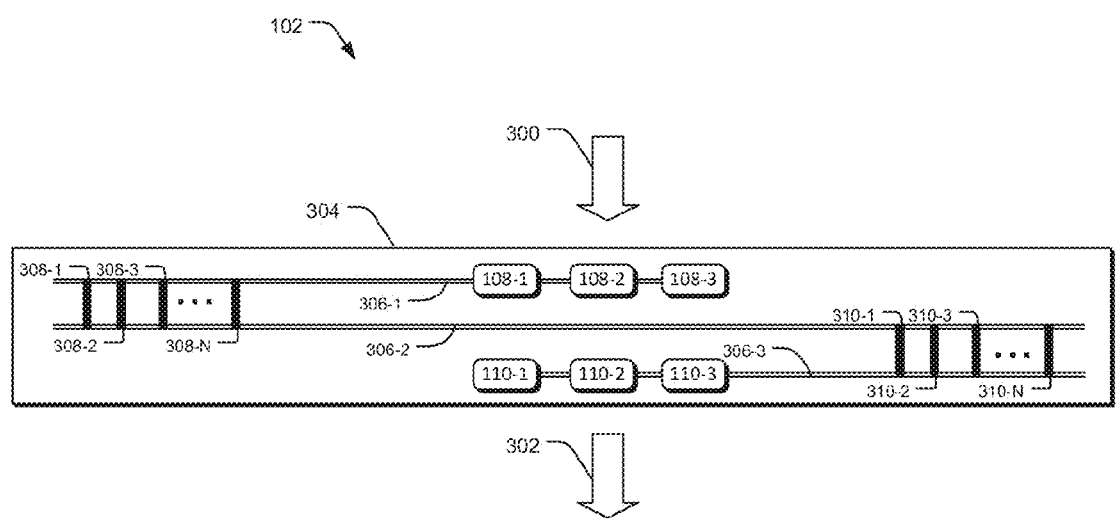
FIG. 3 is a diagram illustrating an example process tunable resistor with parallel elements/legs that may be added or removed, to adjust resistance.

Referring now to FIG. 3, an alternate example process tunable resistor 102 is shown. As discussed above, the process tunable resistor 102 is fabricated or processed with one or more other components in manufacturing a semiconductor device, such as semiconductor device 100.

An input current 300 may be received from one or more components through one or more fixed input connection points 108 (e.g., connection points 108-1, 108-2, and 108-3). Furthermore, an output current 302 may be provided through one or more fixed output connection points 110 (e.g., connection points 110-1, 110-2, and 110-3).

A die area 304 is provided for the process tunable resistor 102. The die area 204 may be fixed. In other words, as the fabrication process for the process tunable resistor 102 changes (matures), the die area 304 may remain the same. Various known materials may make up the die area 304, and process tunable resistor 102.

In this example, process tunable resistor 102 includes three legs 306-1, 306-2, and 306-3. The legs 306 may remain a fixed length as the fabrication process changes (matures). Leg 306-1 connects with fixed input connection points 108, and Leg 306-3 connects with fixed output connection points 110.

Leg 106-1 is connected to leg 306-2 through a plurality of parallel sub-legs 308-1 to 308-N. Likewise leg 306-3 is connected to leg 306-2 a. plurality of parallel sub-legs 310-1 to 310-N. In this implementation, the resistance of process tunable resistor 102 is determined by the number of sub-legs 308 and 310 are included. In a fabrication process of process tunable resistor 102, a particular number of sub-legs 308 and 310. The greater number of sub-legs 308 and 310, leads to a greater resistance value of process tunable resistor 102. The fewer number of sub-legs 308 and 310, the lower resistance value of process tunable resistor 102. It is understood that different configurations/elements, other than sub-legs, may be implemented. Therefore actual resistance is provided through connections 108 and 110, legs 306, and sub-legs 308 and 310.

In a particular embodiment, legs 306-1 and 306-3 are balanced with equal lengths, and are considered symmetrical. This symmetrical legging may compensate for additional variations in processes. In other implementations, asymmetrical legging may be used. As discussed above, mask layering may be used to process/manufacture the process tunable resistor 102 and its components. In certain process, a re-tape of a mask may be performed for sub-legs 308 and 310.

Example Process

Figure 4:
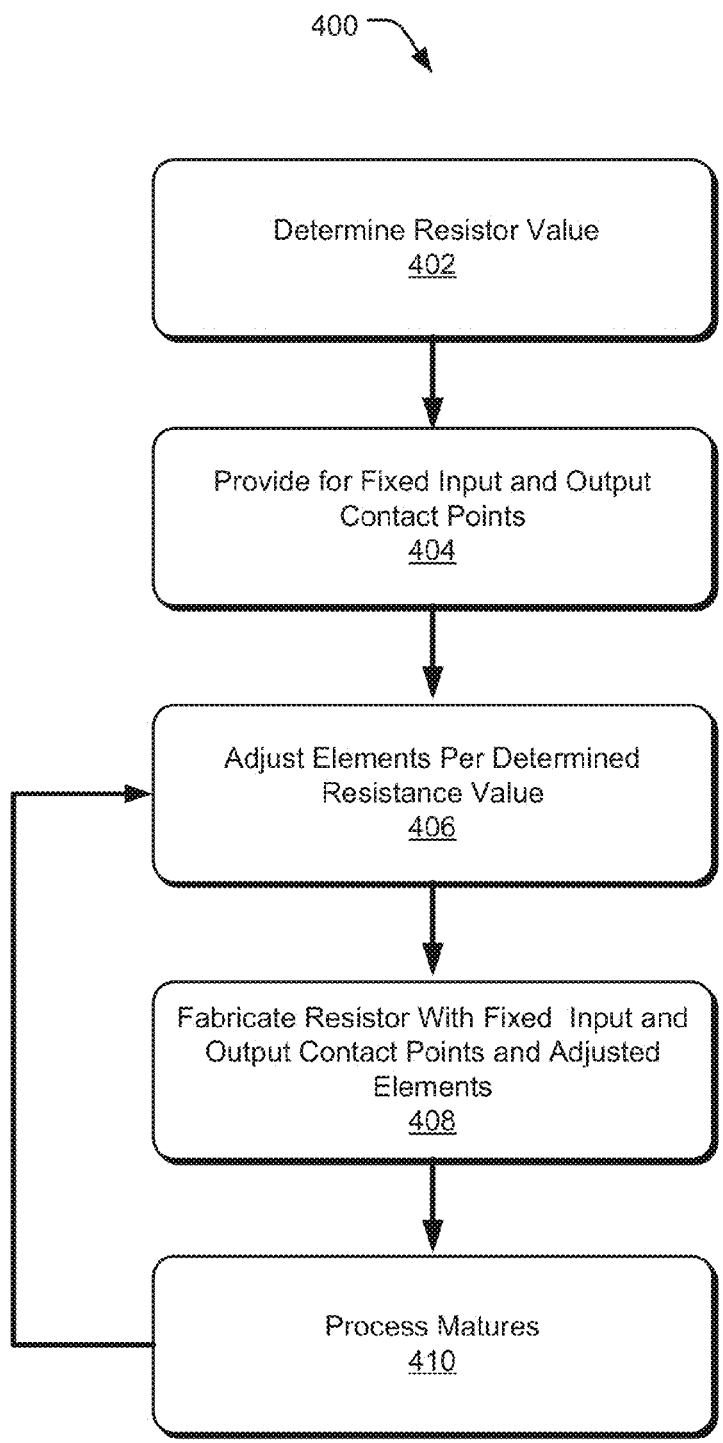
FIG. 4 is a flow chart illustrating an example method to process tune a resistor.

FIG. 4 shows an example process 400 to tune a resistor in fabrication/processing. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, determining resistance value is performed. In particular, resistance value is determined based on a circuit architecture design. Consideration is made as to resistance of material or materials used in fabrication or processing the resistor and other components of the circuit.

At block 404, providing fixed input and output contact points for the resistor is performed. The fixed input and contact points are determined based on architectural design accounting for other components, such as transistors that connect with the resistor in the fabrication process.

At block 406, adjusting of elements of the resistor is performed. In particular, elements of the resistor may be lengthened or shortened. As discussed above, elements such as turns providing resistance may be slid or strategically placed along symmetrical or asymmetrical legs that define the resistor. In other implementations, elements such as sub-legs may be added or removed depending on the desired resistance.

At block 408, fabrication is performed to create resistor, along with any other components of the circuit. Fabrication may be through the use of mask layers and deposition, and/or any other semiconductor process(es).

At block 410, fabrication process matures or changes, affecting the circuit and the resistor. Therefore, determination or accounting may be performed for such changes based on the process maturation. Based on the changes, block 406 is performed.

Realizations in accordance with the present invention have been described in the context of particular embodiments. These embodiments are mea to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements ma fall within the scope of the invention as defined in the claims that follow.

The invention claimed is:

1. A semiconductor die, comprising:
   a die substrate;
   a resistor above the die substrate, the resistor including:
      a first conductive pathway extending in a first direction, wherein the first conductive pathway has an end,
      a second conductive pathway parallel to the first conductive pathway, and
      a third conductive pathway having at least a portion that is perpendicular to the first conductive pathway and to the second conductive pathway, wherein the third conductive pathway electrically couples the first conductive pathway and the second conductive pathway, the third conductive pathway is closer to the end of the first conductive pathway than any other conductive pathway that electrically couples the first conductive pathway and the second conductive pathway, the third conductive pathway contacts the first conductive pathway at a first location along the first conductive pathway, and the first location is spaced apart from the end of the first conductive pathway; and
   at least one electrical contact structure in contact with the first conductive pathway at a second location along the first conductive pathway, wherein the first location is between the end of the first conductive pathway and the second location along the first conductive pathway.

2. The semiconductor die of claim 1, wherein the third conductive pathway is one of a plurality of third conductive pathways, individual ones of the third conductive pathways electrically couple the first conductive pathway and the second conductive pathway, and individual ones of the third conductive pathways contact the first conductive pathway at locations spaced apart from the end of the first conductive pathway.

3. The semiconductor die of claim 1, wherein the third conductive pathway includes at least a portion that is not perpendicular to the first conductive pathway.

4. The semiconductor die of claim 1, wherein:
   the second conductive pathway has an end;
   the third conductive pathway contacts the second conductive pathway at a third location along the second conductive pathway;
   the third location is spaced apart from the end of the second conductive pathway.

5. The semiconductor die of claim 4, further comprising:
   at least one electrical contact structure in contact with the second conductive pathway at a fourth location along the second conductive pathway; and
   the third location is between the end of the second conductive pathway and the fourth location along the second conductive pathway.

6. The semiconductor die of claim 5, wherein the end of the first conductive pathway is a first end, the at least one electrical contact structure is proximate to a second end of the first conductive pathway, and the second end of the first conductive pathway is opposite to the first end of the first conductive pathway.

7. The semiconductor die of claim 1, wherein the resistor further comprises:
   a fourth conductive pathway parallel to the second conductive pathway; and
   a fifth conductive pathway having at least a portion that is perpendicular to the second conductive pathway and to the fourth conductive pathway;
   wherein the fifth conductive pathway electrically couples the second conductive pathway and the third conductive pathway, the second conductive pathway has an end, the fifth conductive pathway is closer to the end of the second conductive pathway than any other conductive pathway that electrical couples the second conductive pathway and the third conductive pathway, the fifth conductive pathway contacts the second conductive pathway at a third location along the second conductive pathway, and the third location is spaced apart from the end of the second conductive pathway.

8. The semiconductor die of claim 7, wherein the fifth conductive pathway is one of a plurality of fifth conductive pathways, individual ones of the fifth conductive pathways electrically couple the second conductive pathway and the fourth conductive pathway, and individual ones of the fifth conductive pathways contact the second conductive pathway at locations spaced apart from the end of the second conductive pathway.

9. The semiconductor die of claim 7, wherein the fifth conductive pathway includes at least a portion that is not perpendicular to the second conductive pathway.

10. The semiconductor die of claim 7, wherein:
    the fourth conductive pathway has an end;
    the fifth conductive pathway contacts the fourth conductive pathway at a fourth location along the fourth conductive pathway;
    the fourth location is spaced apart from the end of the fourth conductive pathway.

11. The semiconductor die of claim 7, wherein the end of the second conductive pathway is a first end of the second conductive pathway, the third conductive pathway is proximate to a second end of the second conductive pathway, the fifth conductive pathway is proximate to the first end of the second conductive pathway, and the second end of the second conductive pathway is opposite to the first end of the second conductive pathway.

12. The semiconductor die of claim 1, wherein the at least one electrical contact structure includes multiple electrical contact structures.

13. The semiconductor die of claim 1, further comprising:
    a first electrical component electrically coupled to the resistor through the one or more electrical contact structures; and
    a second electrical component electrically coupled to the resistor through additional one or more electrical contact structures.

14. A method of manufacturing a semiconductor die, comprising:
    providing a die substrate;
    forming a resistor above the die substrate, the resistor including:
       a first conductive pathway extending in a first direction, wherein the first conductive pathway has an end,
       a second conductive pathway parallel to the first conductive pathway, and a third conductive pathway having at least a portion that is perpendicular to the first conductive pathway and to the second conductive pathway,
wherein the third conductive pathway electrically couples the first conductive pathway and the second conductive pathway, the third conductive pathway is closer to the end of the first conductive pathway than any other conductive pathway that electrically couples the first conductive pathway and the second conductive pathway, the third conductive pathway contacts the first conductive pathway at a first location along the first conductive pathway, and the first location is spaced apart from the end of the first conductive pathway; and
forming at least one electrical contact structure in contact with the first conductive pathway at a second location along the first conductive pathway, wherein the first location is between the end of the first conductive pathway and the second location along the first conductive pathway.

15. The method of claim 14, wherein the third conductive pathway is one of a plurality of third conductive pathways, individual ones of the third conductive pathways electrically couple the first conductive pathway and the second conductive pathway, and individual ones of the third conductive pathways contact the first conductive pathway at locations spaced apart from the end of the first conductive pathway.

16. The method of claim 14, wherein the third conductive pathway includes at least a portion that is not perpendicular to the first conductive pathway.

17. The method of claim 14, wherein the third conductive pathway contacts the second conductive pathway at a location spaced apart from an end of the second conductive pathway.

18. The method of claim 14, wherein the resistor further includes:
a fourth conductive pathway parallel to the second conductive pathway; and
a fifth conductive pathway having at least a portion that is perpendicular to the second conductive pathway and to the fourth conductive pathway;
wherein the fifth conductive pathway electrically couples the second conductive pathway and the fourth conductive pathway, the second conductive pathway has an end, the fifth conductive pathway is closer to the end of the second conductive pathway than any other conductive pathway that electrically couples the second conductive pathway and the fourth conductive pathway, the fifth conductive pathway contacts the second conductive pathway at a third location along the second conductive pathway, and the third location is spaced apart from the end of the second conductive pathway.

19. The method of claim 18, wherein the fifth conductive pathway is one of a plurality of fifth conductive pathways, individual ones of the fifth conductive pathways electrically couple the second conductive pathway and the fourth conductive pathway, and individual ones of the fifth conductive pathways contact the second conductive pathway at locations spaced apart from the end of the second conductive pathway.

20. The method of claim 18, wherein the fifth conductive pathway includes at least a portion that is not perpendicular to the second conductive pathway.

21. The method of claim 14, further comprising:
forming at least one electrical contact structure in contact with the second conductive pathway.

22. The method of claim 14, wherein the end of the first conductive pathway is a first end, the at least one electrical contact structure is proximate to a second end of the first conductive pathway, and the second end of the first conductive pathway is opposite to the first end of the first conductive pathway.

23. The method of claim 14, wherein the at least one electrical contact structure includes multiple electrical contact structures.

* * * * *

UNITED STATES PATENT AND TRADEMARK OFFICE
CERTIFICATE OF CORRECTION

| | | |
|---|---|---|
| PATENT NO. | : 9,679,686 B2 | Page 1 of 1 |
| APPLICATION NO. | : 13/977049 | |
| DATED | : June 13, 2017 | |
| INVENTOR(S) | : Scot E. Zickel et al. | |

It is certified that error appears in the above-identified patent and that said Letters Patent is hereby corrected as shown below:

In the Claims

In Column 6, Line 17, in Claim 7, delete "electrical" and insert -- electrically --, therefor.

Signed and Sealed this
Third Day of October, 2017

Joseph Matal
*Performing the Functions and Duties of the*
*Under Secretary of Commerce for Intellectual Property and*
*Director of the United States Patent and Trademark Office*